(12) United States Patent
Chen et al.

(10) Patent No.: US 7,883,348 B2
(45) Date of Patent: Feb. 8, 2011

(54) BURN-IN SOCKET WITH SLIDING MEMBER MOVABLE IN DUAL DIRECTIONS

(75) Inventors: Ming-Yue Chen, Tu-Cheng (TW); Jia-Jia Cai, Shenzhen (CN)

(73) Assignee: Hon Hai Precision Ind. Co., Ltd., Taipei Hsien (TW)

(*) Notice: Subject to any disclaimer, the term of this patent is extended or adjusted under 35 U.S.C. 154(b) by 0 days.

(21) Appl. No.: 12/715,404

(22) Filed: Mar. 2, 2010

(65) Prior Publication Data

US 2010/0221929 A1  Sep. 2, 2010

(30) Foreign Application Priority Data

Mar. 2, 2009  (TW) .............................. 98203090 U (51) Int. Cl.
*H01R 13/625* (2006.01)
(52) U.S. Cl. ...................................... 439/259; 439/342
(58) Field of Classification Search .................. 439/259, 439/342
See application file for complete search history.

(56) References Cited

U.S. PATENT DOCUMENTS

| | | | | |
|---|---|---|---|---|
| 6,371,782 B1 * | 4/2002 | Ohashi | ........................ | 439/266 |
| 6,379,172 B1 * | 4/2002 | Howell et al. | ................ | 439/342 |
| 6,890,201 B2 * | 5/2005 | Hashiguchi et al. | ......... | 439/259 |
| 7,175,462 B2 * | 2/2007 | Hashimoto | ................... | 439/342 |

* cited by examiner

*Primary Examiner*—Gary F. Paumen
(74) *Attorney, Agent, or Firm*—Andrew C. Cheng; Wei Te Chung; Ming Chieh Chang (57) ABSTRACT

A burn-in socket comprises a base, a plurality of terminals received in the base, a lid mounted upon the base, and a sliding member mounted on the base. The terminal has a movable arm and a static arm, the lid has a number of actuating portions downwardly extending from the bottom thereof to drive the sliding member. The actuating portion of the lid drives the sliding member to move in both a longitudinal direction and a transverse direction, so that the movable arm moves not only in the longitudinal direction but also in the transverse direction to avoid interference with a static arm of an adjacent terminal.

20 Claims, 9 Drawing Sheets

BURN-IN SOCKET WITH SLIDING MEMBER MOVABLE IN DUAL DIRECTIONS

FIELD OF THE INVENTION

The present invention relates to a burn-in socket for testing an IC package, and particularly to a burn-in socket having a sliding member, which can move in a longitudinal and a transverse directions.

DESCRIPTION OF RELATED ART

Burn-in socket is an indispensable equipment for ensuring the proper normal function of an integrated circuits (IC) package before it is delivered. Conventional burn-in sockets typically include a base with a plurality of terminals, a lid mounted upon the base and movable in a top-to-bottom direction, and a sliding board assembled on the base and driven by the lid to slide in a longitudinal direction. The terminal usually has a pair of clamping arms including a movable arm and a static arm, the movement of the sliding board can bring the clamping arms to open.

When the IC package with solder balls on a bottom thereof is disposed in the socket for testing, the lid is firstly downwardly pressed to bring the sliding member to horizontally slide on the base in the longitudinal direction, then the sliding board forces the movable arm of the terminal to move away from the static arm so as to accommodate the solder ball therebetween, after the IC package is seated and the lid is released, then the movable arm bounces back and clamps one solder ball of the IC package with the static arm. As the solder ball becomes smaller and smaller, in order to ensure that the clamping arms can reliably clamp the solder ball, a nearest transverse distance between the movable arm and the static arms is very small, even approaches to zero, in this case, the movable arm of this type terminal may interfere with another static arm of another terminal during its movement, if such situation happens, that will not only damage the another terminal but also influence the opening process of the movable arm and, that means the clamping arms can not clamp the solder ball and the IC package can not electrically connect with the socket.

Hence, an improved socket is required to overcome the above-mentioned disadvantages of the related art.

SUMMARY OF THE INVENTION

An object of the present invention is to provide a socket which can reliably clamp solder balls of an IC package and prevent interferences between adjacent terminals.

To achieve the aforementioned object, a socket, for electrically connecting an integrated circuit (IC) package, comprises a base with a plurality of terminals received therein, a lid mounted upon the base and movable relative to the base along a top-to-bottom direction, and a sliding member mounted on the base and driven by the lid. The lid has a plurality of actuating portions formed with contacting edges and contacting faces on two ends thereof. The sliding member is formed with bearing portions and protrusion portions, the contacting edge of the lid pushes the bearing portion to force the sliding member to move in a longitudinal direction, and the contacting face pushes the protrusion portion to force the sliding member to move in a transverse direction perpendicular to the longitudinal direction.

Other objects, advantages and novel features of the invention will become more apparent from the following detailed description of a preferred embodiment when taken in conjunction with the accompanying drawings.

DETAILED DESCRIPTION OF THE INVENTION

Figure 1:
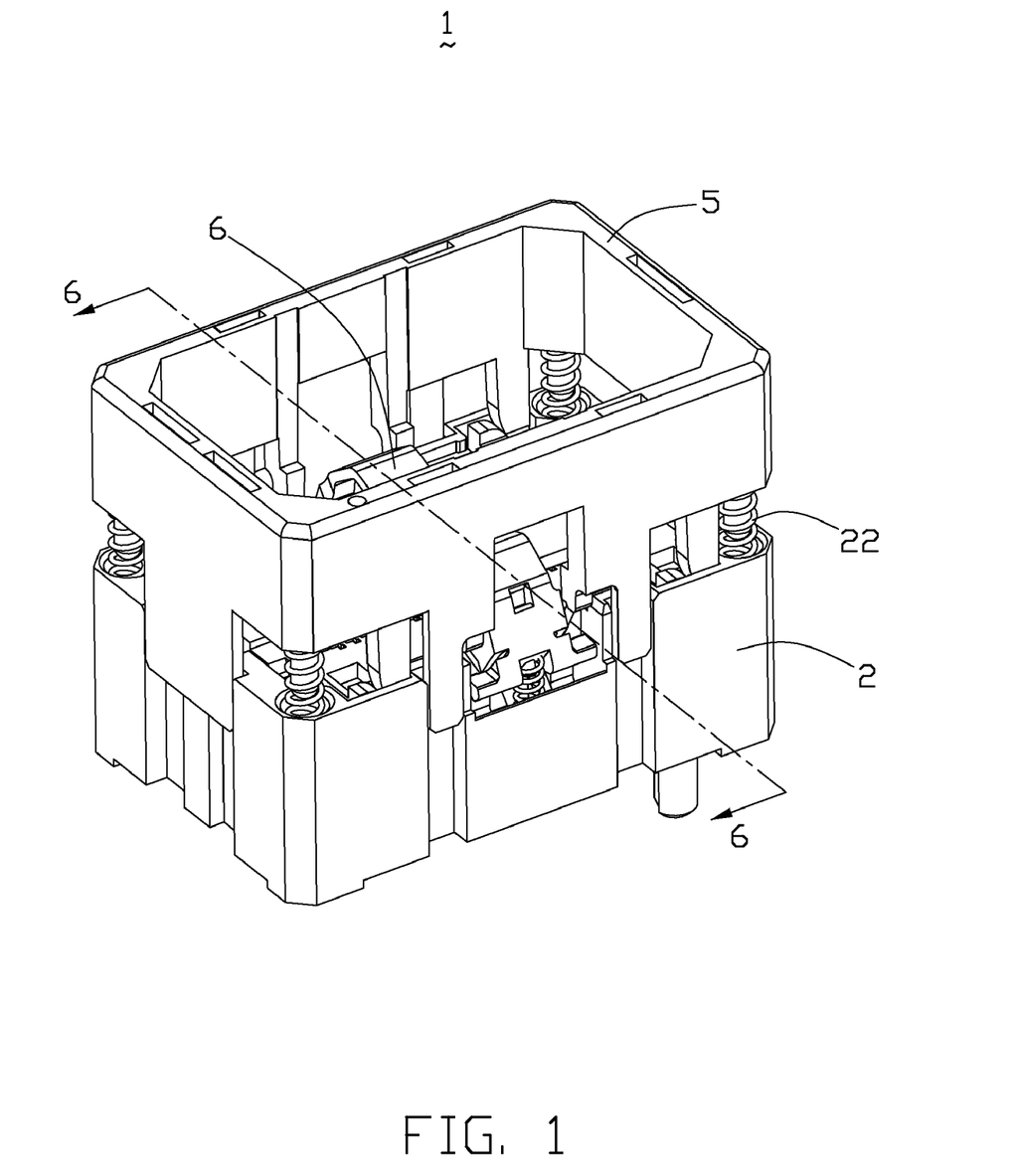
FIG. 1 is an assembled, perspective view of a socket with an IC package in accordance with a preferred embodiment of present invention.
Figure 2:
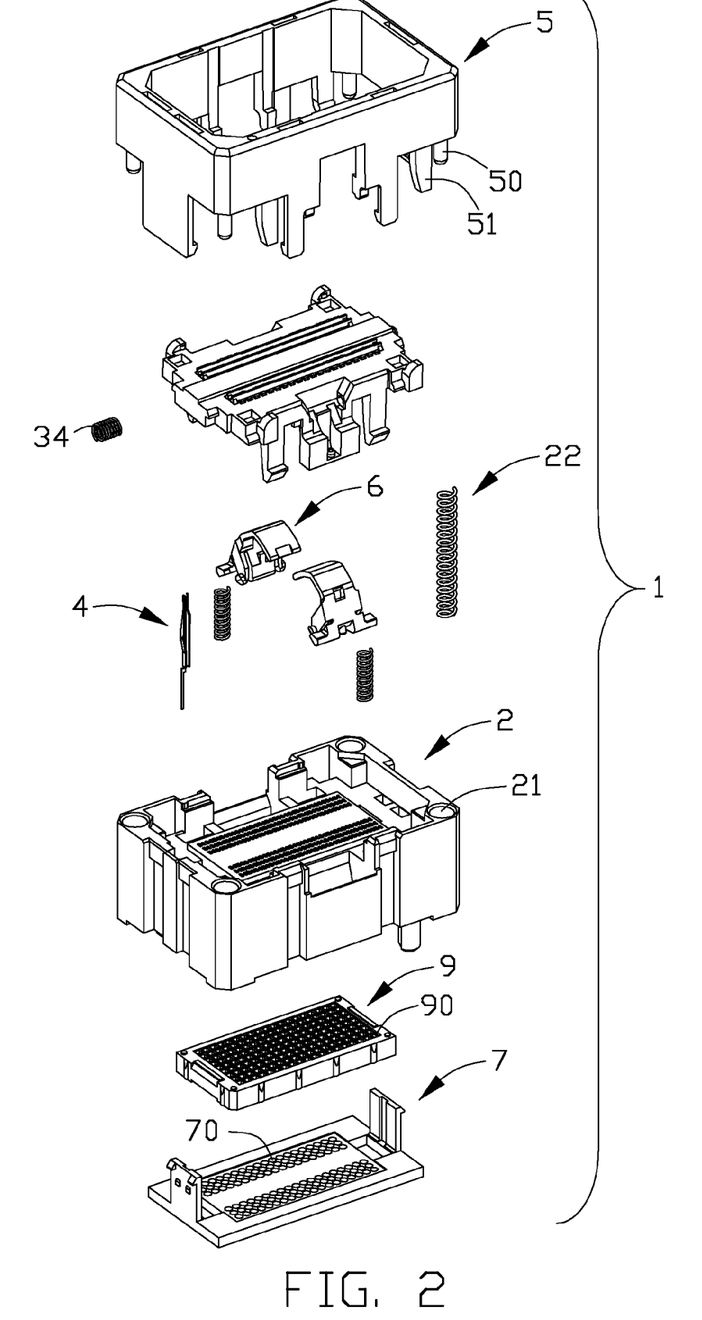
FIG. 2 is another exploded, perspective view of the socket.

Referring to FIGS. 1 and 2, the burn-in socket 1 is used to electrically connect an IC package 8 and comprises a base 2, a sliding member 3 mounted on the base 2, a plurality of terminals 4 received in the base 2, a lid 5 mounted upon the base 2 and used to drive the sliding member 3, a pair of pressing members 6 located on two opposite ends of the sliding member 3, and a first retaining board 7 and a second retaining board 9 both mounted to a bottom of the base 2.

The base 2 has a rectangular configuration, and defines a plurality of contact passageways in a center thereof and four receiving holes 21 on four corners thereof for receiving springs 22 (only one shown). The terminal 4 includes a main body 40, a pair of clamping arms 41, 42 upwardly extending from the main body 40 and a soldering portion 43 downwardly extending from the main body 40. The clamping arms 41, 42 include a static arm 41 with a linear configuration and a movable arm 42 with deflectable elasticity. Tip portions of the clamping arms can clamp a solder ball 80 on the bottom of the IC package 8 (see FIG. 6).

Figure 3:
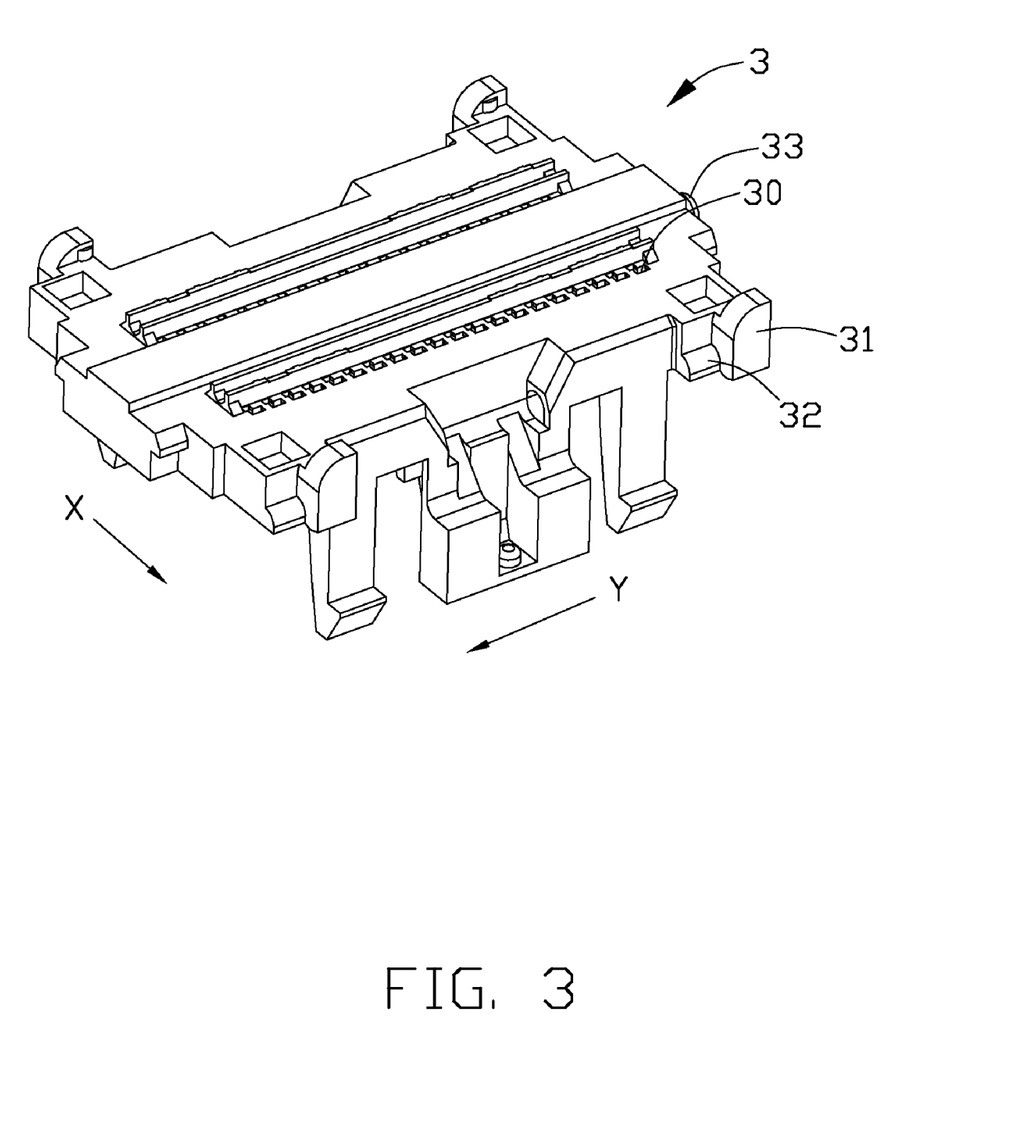
FIG. 3 is a perspective view of a sliding member of the socket.

Referring to FIG. 3, the sliding member 3 is assembled on the base 2, and defines a plurality of contact holes 30 for the terminal 4. The sliding member 3 is provided with a post 33 in the middle of a transverse end thereof for positing another spring 34. The sliding member 3 has a plurality of bearing portions 31 protruding from two sides of two longitudinal ends thereof, each bearing portion 31 has an arch surface extending in Y direction. Two protrusion portions 32 are formed on one of the two sides and juxtaposed with two of the bearing portions 31, each protrusion portion has another arch surface extending in X direction which is perpendicular to the Y direction. The bearing portion 31 is used to be driven by the lid 5 to trigger the horizontal movement of the sliding member 3 the sliding member 3 to horizontally move along the Y direction, the protrusion portion 32 is used to be driven by the lid 5 to bring the sliding member 3 to horizontally slide along the X direction, the sliding member 3 returns back by restoring forces of the springs 34 and restoring forces of the movable arms 42 as well which are driven to move by the sliding member 3.

Figure 4:
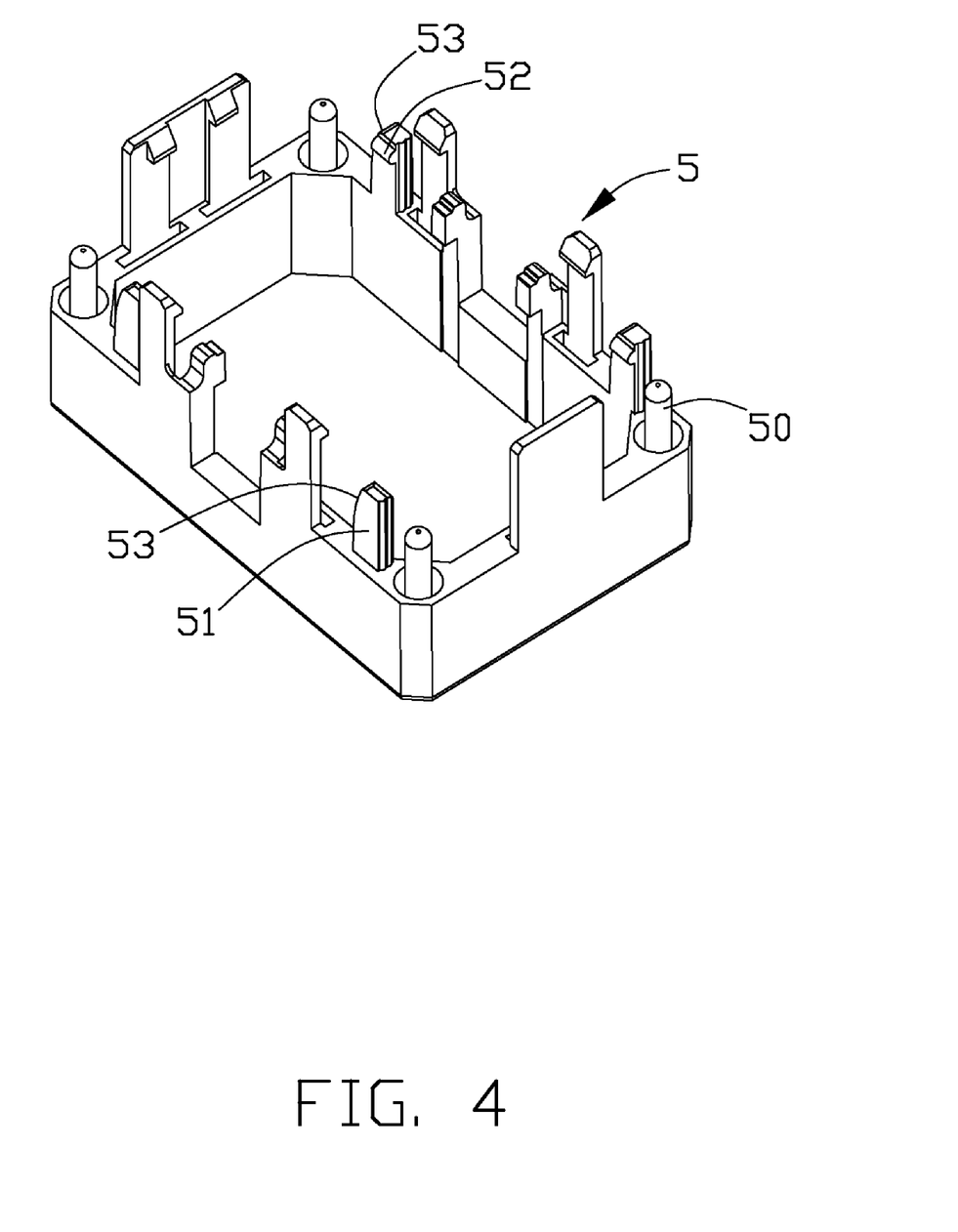
FIG. 4 is a perspective view of a lid of the socket.
Figure 5:
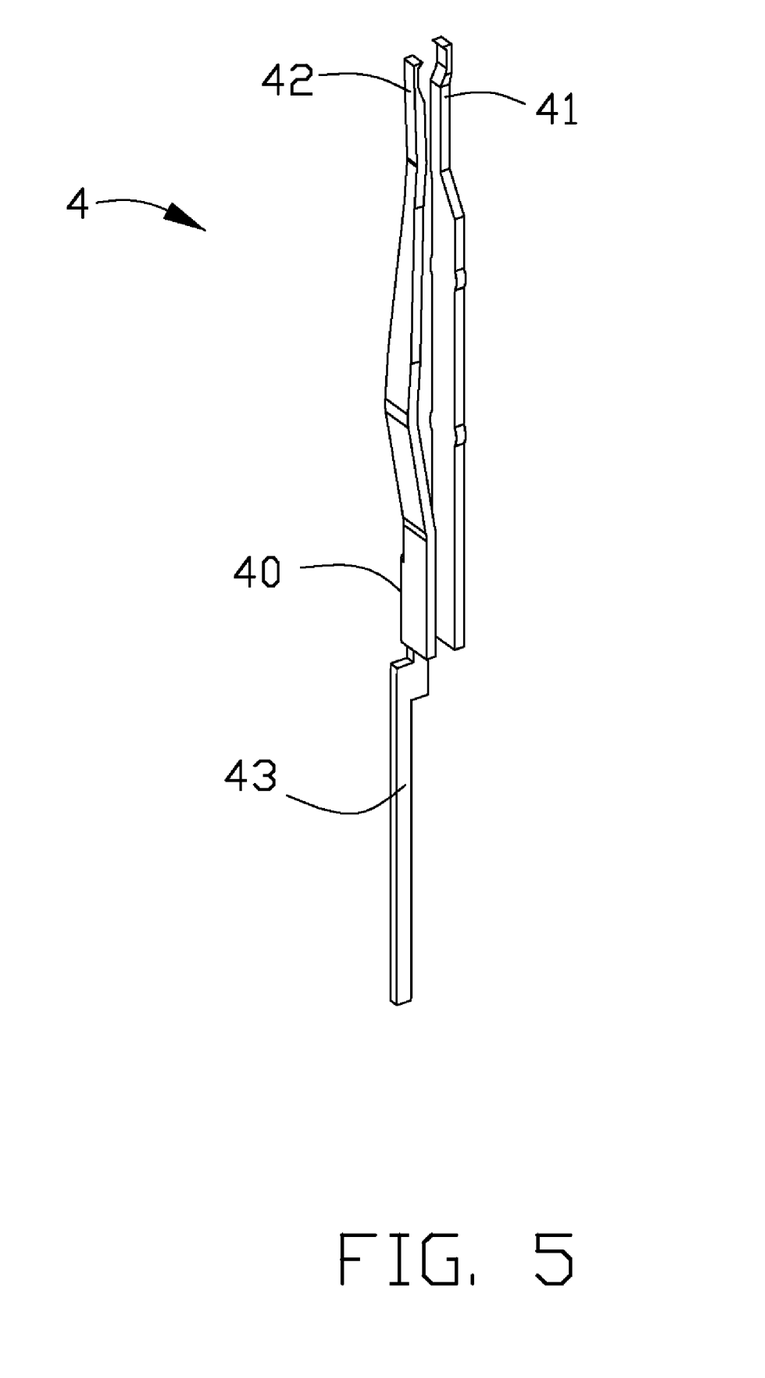
FIG. 5 is a perspective view of a terminal of the socket.

Referring to FIGS. 2 and 4, the lid 5 has a frame-like configuration, which is mounted upon the base 2 and movable relative to the base 2 along the top-to-bottom direction, the lid 5 has a plurality of poles 50 extending downwardly from four corners thereof, the poles 50 insert through the springs 22 and then into the receiving holes 21 of the base 2, the springs 22 provide elastic forces for returning of the lid 5. The pole 50 is provided with a plurality of actuating portions 51 downwardly extending from an inner side thereof, each actuating portion 51 has an arch contacting edge 53 on a lateral side thereof, and two of the actuating portions 51 each is formed with a contacting face 52 on an inner side thereof and corresponding to the protrusion portion 32 of the sliding member 3.

Figure 6:
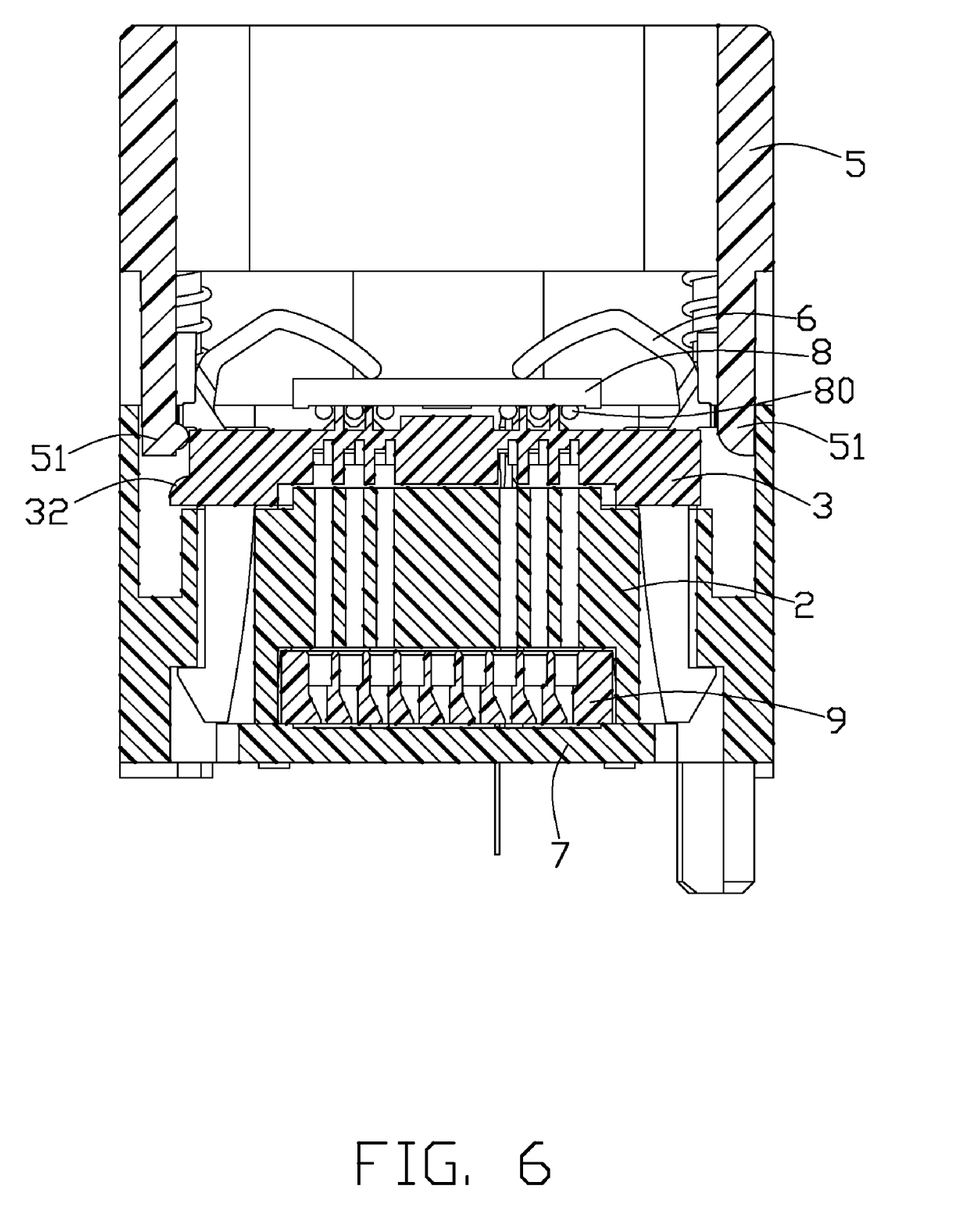
FIG. 6 is a sectional view of the socket along line 6-6 in FIG. 1.

Referring to FIGS. 2 and 6, the pair of pressing members 6 are assembled to the base 2 and located on middles of the two longitudinal sides, the pressing member 6 is also actuated by the lid 5. When the lid 5 moves downwardly, the pressing member 6 rotates upwardly to an open state, then, the IC package 8 is put in or taken out of the sliding member 3 by vacuum suck equipment. When the lid 5 returns back, the pressing member 6 rotates downwardly to press on the IC package 8. The first retaining board 7 with a plurality of retaining holes 70 for retaining the terminal 4 in a center thereof. The second retaining board 9 is disposed between the retaining board 7 and the base 2 and has a plurality of retaining holes 90 for retaining the terminal 4 in a center thereof.

Figure 7:
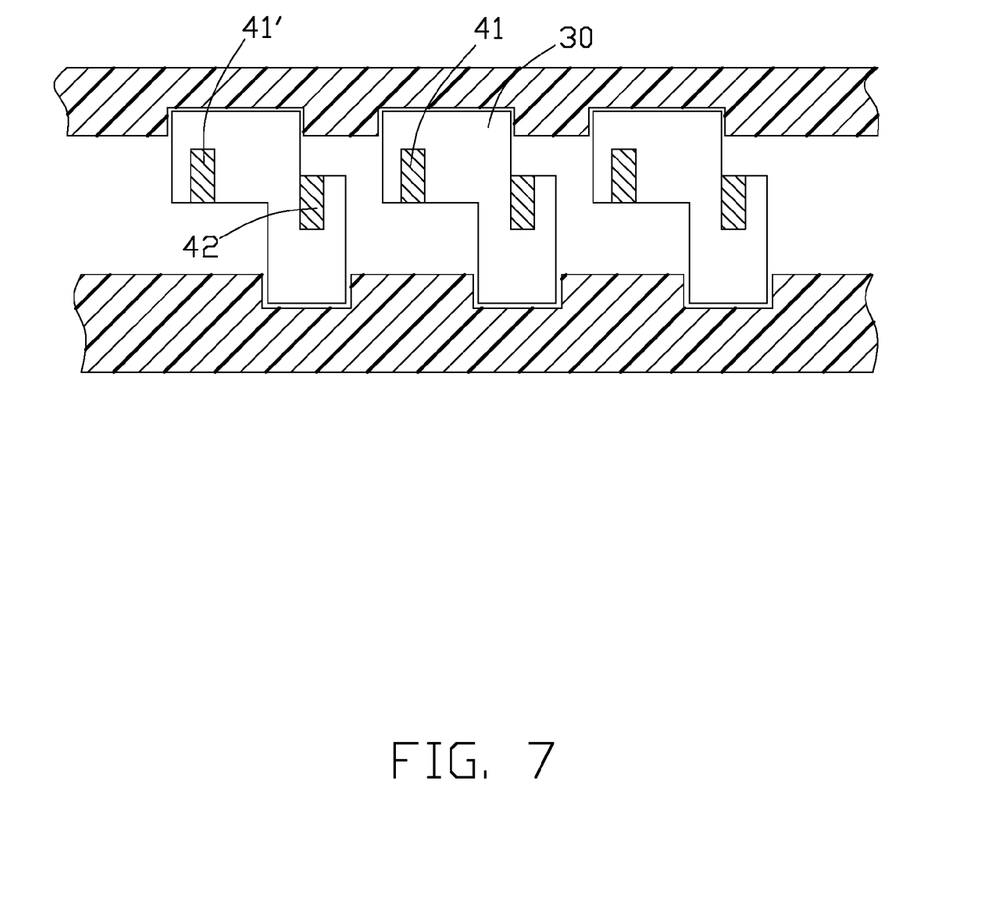
FIG. 7 is a sketch view, showing original positions of clamping arms of the terminals of the socket.
Figure 8:
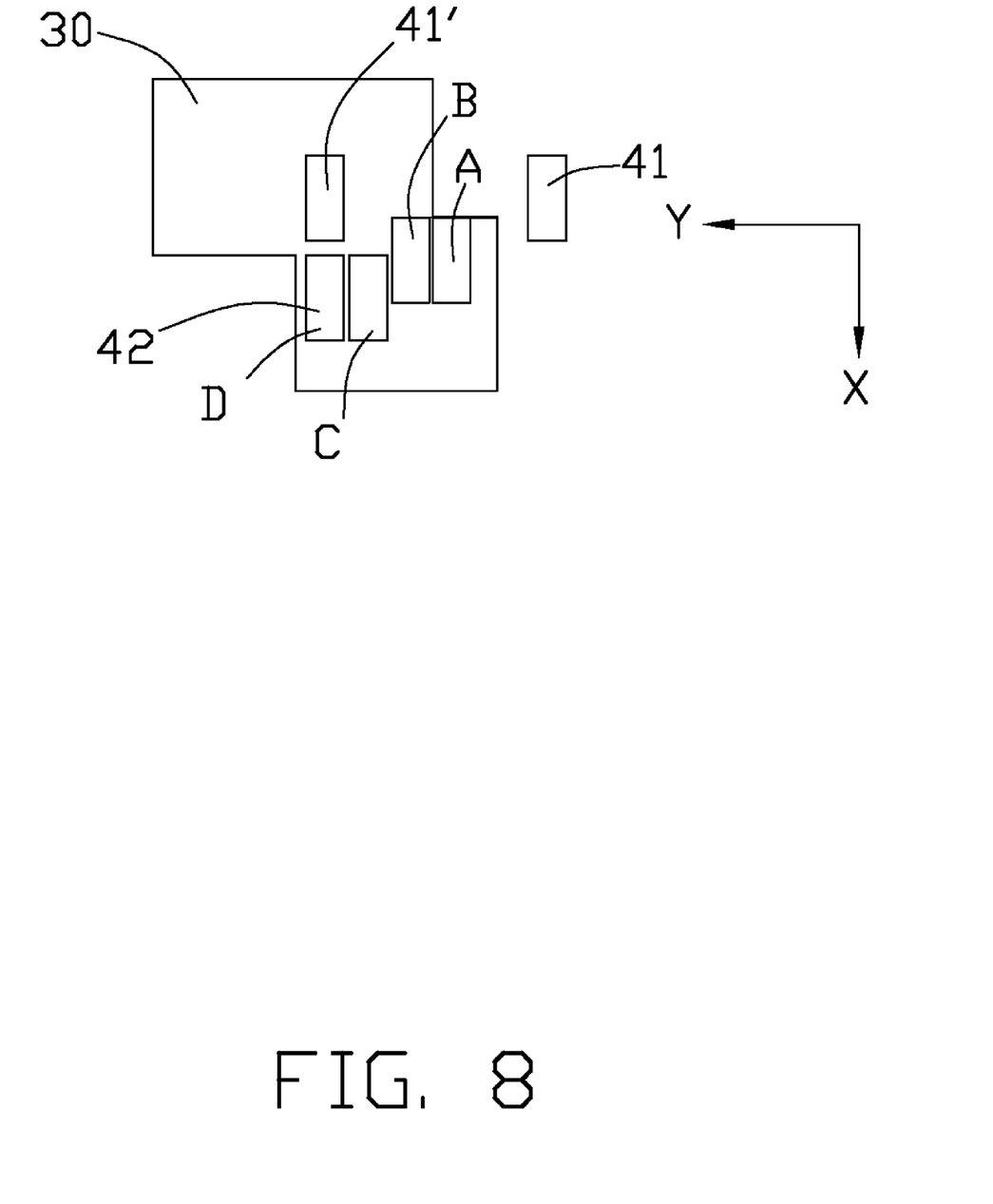
FIG. 8 is a diagrammatic view, showing a movement trace of a movable arm of the terminal of the socket.
Figure 9:
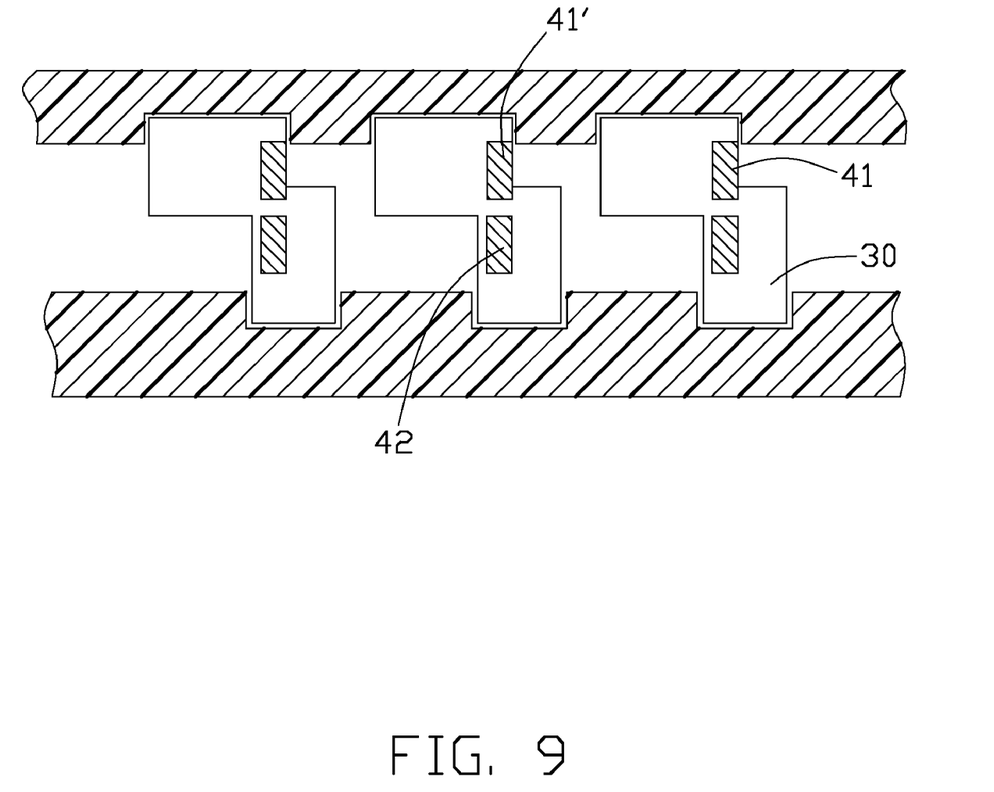
FIG. 9 is similar with FIG. 7, but showing a final open state of the terminal of the socket.

Referring to FIGS. 7 and 9, originally, the movable arm 42 is located at position A, where the movable arm 42 overlapping with the static arm 41 in a transverse direction, in other embodiment, they may not overlap with each other, and a small distance may be existed therebetween. When the lid 5 is depressed, the contacting edge 53 of the actuating portion 51 of the lid 5 pushes the bearing portion 31 of the sliding portion 3 to horizontally slide along the Y direction, the static arm 41 of the terminal 4 remains at its original state, while the movable arm 42 is forced by the sliding member 3 to move from position A to position B, which is a semi-open state, then the lid 5 is pressed unceasingly, the contacting face 52 of the actuating portion 51 begins to push the protrusion portion 32 of the sliding portion 3, so the sliding member 3 begins to move along both X and Y directions until the movable arm 42 is forced to arrive position C, the movement of the movable arm 42 in the X direction can avoid the movable arm 42 to interfere with an adjacent static arm 41' of another terminal 4, by then the sliding member 3 finishes its movement in the Y direction, but not in the X direction, the contacting edge 53 further pushes the bearing portion 31 of the sliding member 3 to move along the Y direction, then the movable arm 42 moves from position C to position D, referring to FIG. 9, where the movable arm 42 of the terminal 4 moves under the static arm 41' of the another terminal 4 without interference with the static arm 41'. When the lid 5 is released, the springs 22 bring the lid 5 back, at the same time, the spring 34 and the movable arms 42 of terminals 4 push the sliding member 3 back.

However, the disclosure is illustrative only, changes may be made in detail, especially in matter of shape, size, and arrangement of parts within the principles of the invention.

What is claimed is:

1. A socket, for electrically connecting an integrated circuit (IC) package, comprising:
    a base with a plurality of terminals received therein;
    a lid mounted upon the base and movable relative to the base along a top-to-bottom direction, the lid having a plurality of actuating portions formed with contacting edges and contacting faces on two ends thereof; and
    a sliding member mounted on the base and driven by the lid, the sliding member formed with bearing portions and protrusion portions, the contacting edge of the lid pushing the bearing portion to force the sliding member to move in a longitudinal direction, and the contacting face pushing the protrusion portion to force the sliding member to move in a transverse direction perpendicular to the longitudinal direction.

2. The socket as claimed in claim 1, wherein the bearing portions project downwardly from two ends of two longitudinal sides of the sliding member, respectively, and the protrusion portions are disposed on two ends of one of the longitudinal sides, respectively.

3. The socket as claimed in claim 2, wherein the protrusion portions are disposed beside the bearing portions.

4. The socket as claimed in claim 3, wherein the contacting edge is disposed on a lateral side of the actuating portion, the contacting face is formed on an inner side of the actuating portion.

5. The socket as claimed in claim 1, wherein each bearing portion has an arch surface extending in the longitudinal direction, each protrusion portion has another arch surface extending in the transverse direction.

6. The socket as claimed in claim 1, wherein the terminal has a movable arm and a static arm, and the movable arm is forced to move by the sliding member both in the longitudinal and the transverse directions.

7. The socket as claimed in claim 6, wherein the movable arm originally overlaps with the static arm in the transverse direction.

8. The socket as claimed in claim 6, wherein the moveable arm moves in both the longitudinal and the transverse directions at a same time when both the contacting edges and the contacting faces push the sliding member.

9. The socket as claimed in claim 8, wherein the moveable arm firstly moves only in the longitudinal direction.

10. The socket as claimed in claim 8, wherein after finishing its movement in the transverse direction, the movable arm further moves in the longitudinal direction.

11. The socket as claimed in claim 6, further comprising a pair of pressing members assembled to the base for pressing the IC package.

12. A burn-in socket comprising:
    a base;
    a plurality of terminals received in the base, each terminal having a movable arm and a static arm;
    a lid mounted upon the base, the lid having a plurality of actuating portions downwardly extending from the bottom thereof; and
    a sliding member mounted on the base and driven by the lid to move and bring the moveable arm to open; wherein
    the lid drives the sliding member to move in both a longitudinal direction and a transverse direction, so that the movable arm moves not only in the longitudinal direction but also in the transverse direction to avoid interference with a static arm of an adjacent terminal.

13. The burn-in socket as claimed in claim 12, wherein the movable arm originally overlaps with the static arm in the transverse direction.

14. The burn-in socket as claimed in claim 12, wherein the lid is provided with a plurality of actuating portions, which has a contacting edge on lateral side thereof and a contacting face on an inner side thereof.

15. The burn-in socket as claimed in claim 14, wherein the sliding member has arch surfaces extending in the longitudinal direction and another arch surfaces extending in the transverse direction, which are pushed by the contacting edge and the contacting face, respectively.

16. The burn-in socket as claimed in claim 12, wherein the moveable arm moves in both the longitudinal and the transverse directions at a same time when both the contacting edges and the contacting faces push the sliding member.

17. A burn-in socket for use with a CPU, comprising:
a base;
a plurality of terminals received in the base, each terminal having a movable arm and a static arm;
a lid mounted upon the base, the lid having a plurality of actuating portions downwardly extending from the bottom thereof; and
a sliding member mounted on the base and driven by the lid to move and bring the moveable arm to open; wherein
the lid drives the sliding member to move in both a longitudinal direction and a transverse direction, so as to move the movable arm from a closed position where the moveable arm is at least partially aligned with the static arm in said longitudinal direction for efficiently cooperating with said static arm to sandwiching an electronic part of the CPU, and to an open position where the moveable arm is essentially aligned with the static arm of the corresponding neighboring terminal in said transverse direction so as to allow greater tolerance of zero insertion consideration.

18. The burn-in socket as claimed in claim 17, wherein a movement path of the sliding member in a top view, includes first, second and third stages under condition that the first stage and the third stage are involved with a same type movement while the second stage is involved with a different type movement.

19. The burn-in socket as claimed in claim 18, wherein the first stage and the third stage are only involved with movement along the longitudinal movement while the second stage is involved with movement along both the longitudinal direction and the transverse direction.

20. The burn-in socket as claimed in claim 17, wherein a movement path of the sliding member in a top view is essentially a translation.

* * * * *